United States Patent [19]

Flores et al.

[11] Patent Number: 5,500,377
[45] Date of Patent: Mar. 19, 1996

[54] METHOD OF MAKING SURGE SUPPRESSOR SWITCHING DEVICE

[75] Inventors: Emmanuel S. Flores; Juan L. D. V. Padilla, both of Jalisco, Mexico

[73] Assignee: Motorola, Inc., Schaumburg, Ill.

[21] Appl. No.: 300,905

[22] Filed: Sep. 6, 1994

[51] Int. Cl.⁶ .................................................. H01L 49/00
[52] U.S. Cl. ........................... 437/6; 437/40; 437/41; 437/50; 437/187; 437/911; 437/933; 437/953; 437/956; 437/958; 257/110; 257/111; 257/112; 257/173; 257/109; 257/119; 148/DIG. 126
[58] Field of Search ..................... 437/6, 933, 953, 437/956, 958, 911, 40 JF, 40 R, 41 JF, 41 R, 50, 187; 257/110, 111, 112, 173, 109, 119; 148/DIG. 126

[56] References Cited

U.S. PATENT DOCUMENTS

| | | | |
|---|---|---|---|
| 4,079,403 | 3/1978 | Temple | 257/173 |
| 4,757,025 | 7/1988 | Bender | 437/6 |
| 4,927,772 | 5/1990 | Arthur et al. | 437/6 |
| 4,967,256 | 10/1990 | Pathak et al. | 257/112 |
| 5,175,598 | 12/1992 | Nishizawa et al. | 257/107 |
| 5,227,647 | 7/1993 | Nishizawa et al. | 257/119 |
| 5,352,905 | 10/1994 | Ohta | 257/111 |
| 5,371,385 | 12/1994 | Hayashi et al. | 257/173 |
| 5,376,809 | 12/1994 | Hayashi et al. | 257/173 |

FOREIGN PATENT DOCUMENTS

| | | | |
|---|---|---|---|
| 0396104 | 11/1990 | Japan | 257/119 |
| 3192770 | 8/1991 | Japan | 257/119 |
| 3233973 | 10/1991 | Japan | 257/110 |

*Primary Examiner*—George Fourson
*Assistant Examiner*—Long Pham
*Attorney, Agent, or Firm*—Miriam Jackson

[57] ABSTRACT

A semiconductor device is fabricated which has reduced power dissipation when the device is turned on and runs cooler in surge suppressor applications. This result is achieved by fabricating a device where the breakdown action takes place preferentially under cathode region. The lower power dissipated during the turn-on action enables the device to operate in environmental conditions from −20° C. to 65° C.

8 Claims, 2 Drawing Sheets

METHOD OF MAKING SURGE SUPPRESSOR SWITCHING DEVICE

BACKGROUND OF THE INVENTION

This invention relates, in general, to semiconductor devices and, more particularly, but not limited to, a thyristor semiconductor device.

Wire phone systems are protected by gas modules or semiconductor devices. Home residence phones are typically protected with gas module technology. Semiconductor devices can provide electronic protection of wire telephonic systems where the switching systems are located, but have not been used at home residence phones because semiconductor devices modules are not capable of operating at the home residence phones conditions. The environmental temperature conditions at the home residence phones range from −20° C. to 65° C. In the past, only gas module devices operated in this environment.

Gas module technology is based on plasma gas discharge devices while semiconductor devices are based on p-n junction and carrier transport theory. Semiconductor devices have higher reliability and lower cost.

Thus, it would be desirable to meet the requirements of electronic protection of wire telephonic systems, such as surge, ac induction from power line crossing, leakage and sustain current in environmental conditions from −20° C. to 65° C. with semiconductor devices.

DETAILED DESCRIPTION OF THE DRAWINGS

Figure 1:
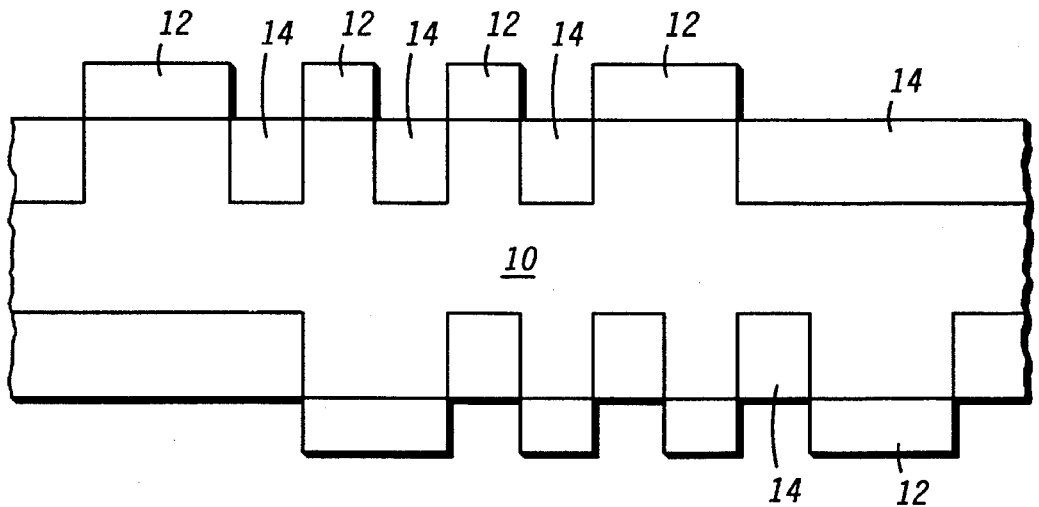
FIG. 1 illustrates a cross-sectional view of an embodiment of the present invention in a beginning stage of fabrication.

FIG. 1 illustrates a cross-sectional view of an embodiment of the present invention. First, a semiconductor material 10 is provided. In a preferred embodiment, semiconductor material 10 is comprised of N-type silicon having a resistivity of 3 to 5 ohm-cm. Although the embodiment describes a device formed with an N-type semiconductor material 10, the opposite conductivity type may be used with the diffusion regions formed thereafter also formed of opposite conductivity type.

A masking layer is formed on the top and bottom surfaces of semiconductor material 10 and thereafter patterned to form masking regions 12 using standard photolithography and etch processes. In a preferred embodiment, the masking layer is comprised of a silicon dioxide layer, however other materials suitable for use as a mask, such as photoresist or other insulating layers, may be used. Masking regions 12 must be thick enough to prevent a dopant from penetrating therethrough to semiconductor material 10. In a preferred embodiment, masking regions 12 are of a thickness of 17,000 to 20,000 Angstroms.

Thereafter, a plurality of anode regions 14 are formed in the semiconductor material 10 where masking regions 12 are not disposed. An array of anode regions 14 are formed inside an anode regions 14 formed as a ring around the array. Anode regions 14 may be formed by a predeposition and diffusion process or an ion implant and diffusion process. In a preferred embodiment, anode regions 14 are diffused to a depth of approximately 37 to 40 microns. Anode regions 14 are P-type regions doped to a sheet resistance of 74 to 80 ohm/sq. It is critical that anode regions 14 be doped in this particular range in order to achieve bulk breakdown far from under the glass passivation region.

Figure 2:
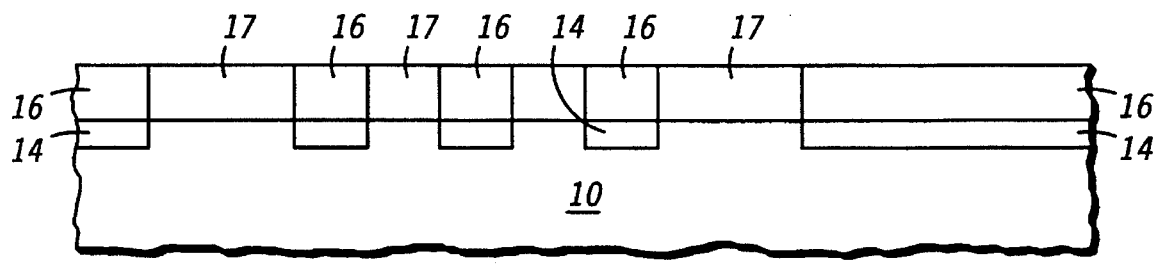
FIG. 2 illustrates a cross-sectional view of an embodiment of the present invention in an intermediate stage of fabrication.

FIG. 2 illustrates the structure of FIG. 1 further along in processing. For illustrative convenience, the bottom half of the structure is not shown in FIGS. 2 and 3. The same processing steps taking place on the top surface take place on the bottom surface. First, masking regions 12 are removed. A blanket doping and diffusion is performed at the surface of semiconductor material 10 to form a diffused region having a depth shallower than anode regions 14. This blanket diffused region forms heavier doped anode regions 16 where anode regions 14 are formed and a plurality of gate regions 17 between anode regions 14 in semiconductor material 10.

It is important that heavier doped anode regions 16 are not diffused below anode regions 14 in order to achieve the benefits of the present invention. Heavier doped anode regions 16 and gate region 17 may be formed by the predeposition or ion implantation methods described above. In a preferred embodiment, heavier doped anode regions 16 are P-type regions having a sheet resistance of 18 to 20 ohm/sq and a junction depth of 42 to 45 microns.

Gate regions 17 are P-type regions having a sheet resistance of 25 to 28 ohm/sq with a junction depth of 27 to 29 microns. The dopant profile of gate regions 17 is required to achieve a lower breakdown voltage and the dopant profile of anode regions 16 is required for achieving a higher breakdown voltage; this parameter is determined by the slope of the respective dopant profile at their final junction depths.

Figure 3:
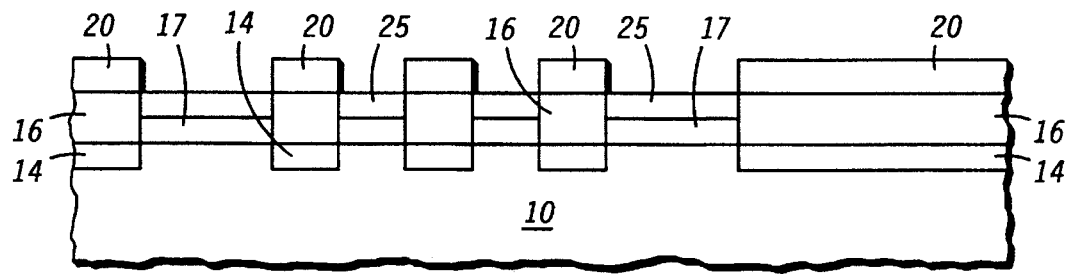
FIG. 3 illustrates a cross-sectional view of an embodiment of the present invention in an intermediate stage of fabrication.

FIG. 3 illustrates the structure of FIG. 2 further along in processing. A masking layer 20 is formed and selectively patterned on the surface of semiconductor material 10 over heavier doped anode regions 16. Masking layer 20 may be comprised of the same materials as masking regions 12. Appropriate thicknesses are chosen in an order to prevent a dopant from penetrating through to heavier doped anode regions 16. A plurality of cathode regions 25 are formed in semiconductor material 10 above and in a portion of gate regions 17. Cathode regions 25 are preferably of a shallower depth than gate regions 17. Cathode regions 25 are formed by conventional processes well known in the art. In a preferred embodiment, cathode regions 25 are N-type regions formed having a surface dopant concentration of 1E20 to 1E21 at ohm/cm$^3$ with a sheet resistance of 0.4 to 0.55 ohm/sq.

Figure 4:
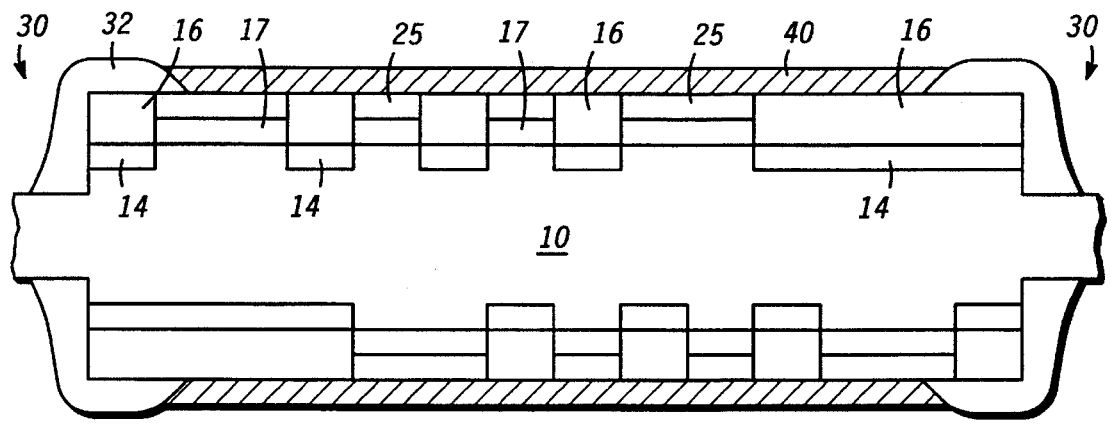
FIG. 4 illustrates a cross-sectional view of an embodiment of the present invention in a final stage of fabrication.

FIG. 4 illustrates the structure of FIG. 3 further along in processing. The bottom portion of the device is now illustrated. First, masking layer 20 is removed. Then, a portion 30 of semiconductor material 10 is removed at the outer edges to form a mesa. This step is preferably performed by etching using a hydrofluoric, nitric and acetic acid mixture. Portion 30 which is removed must extend down into semiconductor material 10 past anode regions 14. Subsequently, passivation 32 is formed at the outer edges of semiconductor material 10 to passivate a portion of exposed anode regions 14 and heavier doped anode regions 16. In a preferred embodiment, passivation 32 is comprised of electronic grade lead/aluminum/silicon oxide glass, however, other suitable materials such as silicon nitride may be used.

The finished device is formed by forming a metal layer 40 to make electrical contact with cathode regions 25 and heavier doped anode regions 16. In a preferred embodiment, metal layer 40 is comprised of aluminum/titanium/nickel/silver layers, however, other metal layers such as nickel alone may be used.

A two-terminal, four or five layer thyristor structure is thus fabricated which reduces the power dissipated when the device is turned on and runs cooler in surge suppressor applications. This result is achieved because the breakdown action takes place preferentially under cathode region 25, which helps to lower its turn-on current (break over current—IBO). The lower power dissipated during the turn-on action enables this kind of device to reach lower temperatures on critical applications, such as electronic protection of wire telephonic systems.

What is claimed is:

1. A method of making a semiconductor device, comprising the steps of:

providing a semiconductor material of a first conductivity type having a top surface and a bottom surface;

forming a plurality of anode regions of a second conductivity type in a portion of the semiconductor material, a first set of the plurality of anode regions extending from the top surface into a portion of the semiconductor material and a second set of the plurality of anode regions extending from the bottom surface into a portion of the semiconductor material, the plurality of anode regions having a more heavily doped portion near the top surface and the bottom surface of the semiconductor material;

forming a plurality of gate regions of the second conductivity type in the semiconductor material between the plurality of anode regions, a first set of the plurality of gate regions extending from below the top surface into a portion of the semiconductor material and a second set of the plurality of gate regions extending from below the bottom surface into a portion of the semiconductor material;

forming a plurality of cathode regions of the first conductivity type in the semiconductor material in between the plurality of anode regions, a first set of the plurality of cathode regions extending from the top surface into the semiconductor material and extending from the bottom surface into a portion of the semiconductor material; and forming an interconnect to make electrical contact to the plurality of cathode regions and the plurality of anode regions.

2. The method of claim 1 wherein the step of forming the plurality of anode regions comprises forming the more heavily doped portion of the plurality of anode regions having a sheet resistance of 18 to 20 ohm/sq.

3. The method of claim 1 wherein the step of forming the plurality of gate regions comprises forming the plurality of gate regions having a sheet resistance of 18 to 20 ohm/sq.

4. The method of claim 1 wherein the step of forming the plurality of gate regions comprises forming the plurality of gate regions having a shallower depth than the plurality of anode regions.

5. A method of making a semiconductor device, comprising the steps of:

providing a semiconductor material of a first conductivity type having a top surface and a bottom surface;

forming a plurality of anode regions of a second conductivity type in a portion of the semiconductor material, a first set of the plurality of anode regions extending from the top surface into a portion of the semiconductor material and a second set of the plurality of anode regions extending from the bottom surface into a portion of the semiconductor material;

forming a first doped region of the second conductivity type extending from the top surface into a portion of the semiconductor material and a second doped region of the second conductivity type extending from the bottom surface into a portion of the semiconductor material, so that the plurality of anode regions are more heavily doped near the top surface and the bottom surface of the semiconductor material;

forming a plurality of gate regions of the second conductivity type in the semiconductor material between the plurality of anode regions, a first set of the plurality of gate regions extending from below the top surface into a portion of the semiconductor material and a second set of the plurality of gate regions extending from below the bottom surface into a portion of the semiconductor material;

forming a plurality of cathode regions of the first conductivity type in the semiconductor material in between the plurality of anode regions above the plurality of gate regions, a first set of the plurality of cathode regions extending from the top surface into a portion of the semiconductor material and a second set of the plurality of cathode region extending from the bottom surface into a portion of the semiconductor material; and forming an interconnect to make electrical contact to the plurality of cathode regions and the plurality of anode regions.

6. The method of claim 5 wherein the step of forming a first doped region and a second doped region comprises forming the first doped region and second doped region having a sheet resistance of 18 to 20 ohm/sq near the top surface and the bottom surface of the semiconductor material.

7. The method of claim 5 wherein the step of forming the plurality of gate regions comprises forming the plurality of gate regions having a sheet resistance of 18 to 20 ohm/sq.

8. The method of claim 5 wherein the step of forming the plurality of gate regions comprises forming the plurality of gate regions having a shallower depth than the plurality of anode regions.

* * * * *